(12) United States Patent
Chen et al.

(10) Patent No.: US 8,595,925 B2
(45) Date of Patent: Dec. 3, 2013

(54) MANUFACTURING METHOD OF IDENTIFIABLE PRINT CIRCUIT BOARD

(75) Inventors: Chih-Kang Chen, Kaohsiung (TW); Tien-Jen Lin, Kaohsiung (TW); Wei-Jen Mai, Kaohsiung (TW)

(73) Assignee: Wus Printed Circuit Co., Ltd, Kaohsiung (TW)

(*) Notice: Subject to any disclaimer, the term of this patent is extended or adjusted under 35 U.S.C. 154(b) by 358 days.

(21) Appl. No.: 12/984,648

(22) Filed: Jan. 5, 2011

(65) Prior Publication Data
US 2011/0265321 A1 Nov. 3, 2011

(30) Foreign Application Priority Data

Apr. 28, 2010 (TW) ................................ 99113523 A

(51) Int. Cl.
H05K 3/02 (2006.01)
(52) U.S. Cl.
USPC .................. 29/846; 29/825; 29/829; 29/834; 174/250; 174/255; 361/748; 361/784; 427/96.1
(58) Field of Classification Search
USPC .................. 29/825, 827, 829, 831, 834, 846; 174/250, 255; 361/748, 784, 760; 427/96.1, 97.1, 98.9
See application file for complete search history.

(56) References Cited

U.S. PATENT DOCUMENTS

| | | | |
|---|---|---|---|
| 4,690,855 A | 9/1987 | Inokuti et al. | |
| 5,357,674 A | 10/1994 | Lumbard | |
| 5,590,461 A * | 1/1997 | Ishida | ............................ 29/830 |
| 6,294,744 B1 | 9/2001 | Kinoshita | |
| 7,263,769 B2 | 9/2007 | Morimoto et al. | |
| 2006/0159885 A1* | 7/2006 | Shirai et al. | ................... 428/131 |

FOREIGN PATENT DOCUMENTS

| | | |
|---|---|---|
| CN | 2582331 Y | 10/2003 |
| JP | 2009194334 A | 8/2009 |
| WO | WO03088724 A1 | 10/2003 |

* cited by examiner

Primary Examiner — Peter DungBa Vo
Assistant Examiner — Jeffrey T Carley
(74) Attorney, Agent, or Firm — Alan Kamrath; Kamrath IP Lawfirm, P.A.

(57) ABSTRACT

A manufacturing method of identifiable print circuit board includes a step of "disposing an identifier", by providing a base plate, defining a surface of the base plate as a manufacturing surface, and disposing a primary identifier on the manufacturing surface; a step of "piling", by sequentially piling up an insulating layer and a circuit layer with a penetrating area on the manufacturing surface, with the penetrating area in alignment with the position of the primary identifier; and a step of "lamination", by laminating the base plate, the insulating layer, and the circuit layer at a temperature not less than 150° C. and a pressure not less than 280 psi to obtain a print circuit board.

5 Claims, 7 Drawing Sheets

MANUFACTURING METHOD OF IDENTIFIABLE PRINT CIRCUIT BOARD

BACKGROUND OF THE INVENTION

1. Field of the Invention

The present invention relates to a manufacturing method of a circuit board and, more particularly, to a manufacturing method of an identifiable print circuit board.

2. Description of the Related Art

Referring to FIG. 1, a conventional manufacturing method of a print circuit board (PCB) is processed by piling up a base plate 91, two thermosetting films 92 and two copper foils 93, with each thermosetting film 92 sandwiched in between the base plate 91 and the copper foils 93; and laminating the base plate 91, the thermosetting films 92 and the copper foils 93 at over 150° C., 280 psi as shown in FIG. 2, to obtain a print circuit board 9 with a first layer of circuit (copper foils 93) formed on the base plate 91. Otherwise, if it is necessary, the above lamination can be repeated to repeatedly laminate additional thermosetting films and copper foils on the first layer of circuit (copper foils 93) to form a print circuit board with a multi-layer of circuits. The thermosetting films are made of polypropylene.

In general, obtained print circuit boards 9 are collected after the manufacture to perform as a batch of print circuit boards 9, followed by providing an identifiable number or a pattern Z to each batch of print circuit boards 9 via a laser processing step, in order to monitor the history of each batch of print circuit boards 9.

However, in the conventional manufacturing method of print circuit boards, the laser processing step for forming the identifiable number or pattern Z onto the print circuit board 9 is carried out at the end of the manufacturing process for each batch of the print circuit boards 9. Thus, it is impossible for the identifiable number or pattern Z to be further used in obtaining the detailed manufacturing record of each print circuit board 9, especially in the early stages of the manufacturing process, such as piling and laminating. Hence, the identifiable number or pattern Z on the print circuit board 9 is incapable of tracking back to the trouble spot of the manufacture process if a defected print circuit board 9 is produced.

Yet, due to the high cost for the laser machine, the cost of the conventional manufacture method will be significantly high if the laser processing step is frequently carried out by forming the identifiable number or pattern Z on each print circuit board 9 in each manufacturing step.

Additionally, although the art of Radio Frequency Identification (RFID) has been widely put to use in each field of remote identification, it is still unable to be used in manufacture of print circuit boards because of the poor tolerance of the RFID chip to high temperature and pressure.

Hence, there is a need for providing a manufacturing method of print circuit boards to improve the above disadvantages.

SUMMARY OF THE INVENTION

The primary objective of this invention is to provide a manufacturing method of identifiable print circuit boards, with effective monitoring of each manufacturing process of the obtained print circuit board.

A manufacturing method of identifiable print circuit boards comprises a step of "disposing an identifier", by providing a base plate, defining a surface of the base plate as a manufacturing surface, and disposing a primary identifier on the manufacturing surface; a step of "piling", by sequentially piling up an insulating layer and a circuit layer with a penetrating area on the manufacturing surface, with the penetrating area in alignment with the position of the primary identifier; and a step of "lamination", by laminating the base plate, the insulating layer, and the circuit layer at a temperature not less than 150° C. and a pressure not less than 280 psi to obtain a print circuit board.

Further scope of the applicability of the present invention will become apparent from the detailed description given hereinafter. However, it should be understood that the detailed description and specific examples, while indicating preferable embodiments of the invention, are given by way of illustration only, since various others will become apparent from this detailed description to those skilled in the art.

BRIEF DESCRIPTION OF THE DRAWINGS

The present invention will become more fully understood from the detailed description given herein below and the accompanying drawings which are given by way of illustration only, and thus are not limitative of the present invention, and wherein.

All figures are drawn for ease of explaining the basic teachings of the present invention only; the extensions of the figures with respect to number, position, relationship, and dimensions of the parts to form the preferred embodiments will be explained or will be within the skill of the art after the following teachings of the present invention have been read and understood. Further, the exact dimensions and dimensional proportions conforming to specific force, weight, strength, and similar requirements will likewise be within the skill of the art after the following teachings of the present invention have been read and understood.

DETAILED DESCRIPTION OF THE INVENTION

Figure 1:
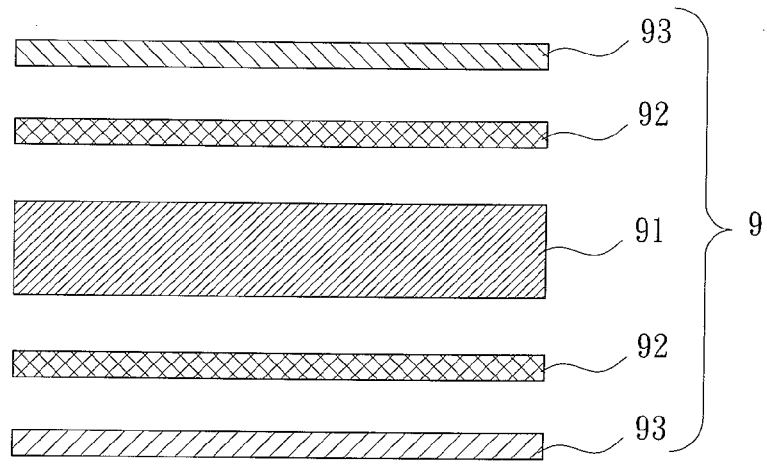
FIG. 1 is a diagram illustrating a step of piling of a conventional manufacturing method of a print circuit board.
Figure 2:
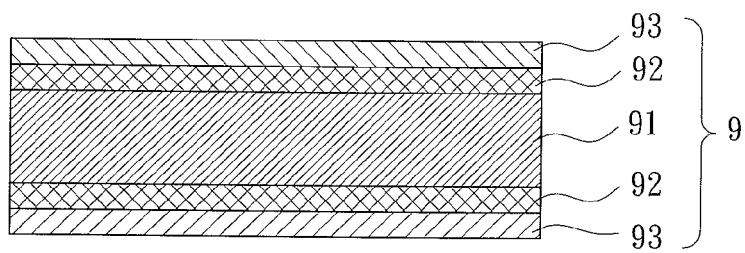
FIG. 2 is a diagram illustrating a step of laminating of a conventional manufacturing method of a print circuit board.
Figure 3:
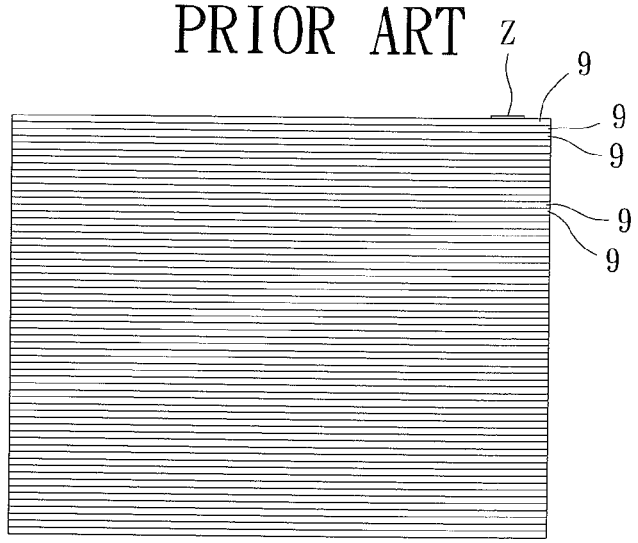
FIG. 3 is a diagram illustrating a step of labeling a batch number on conventional print circuit boards.
Figure 4:
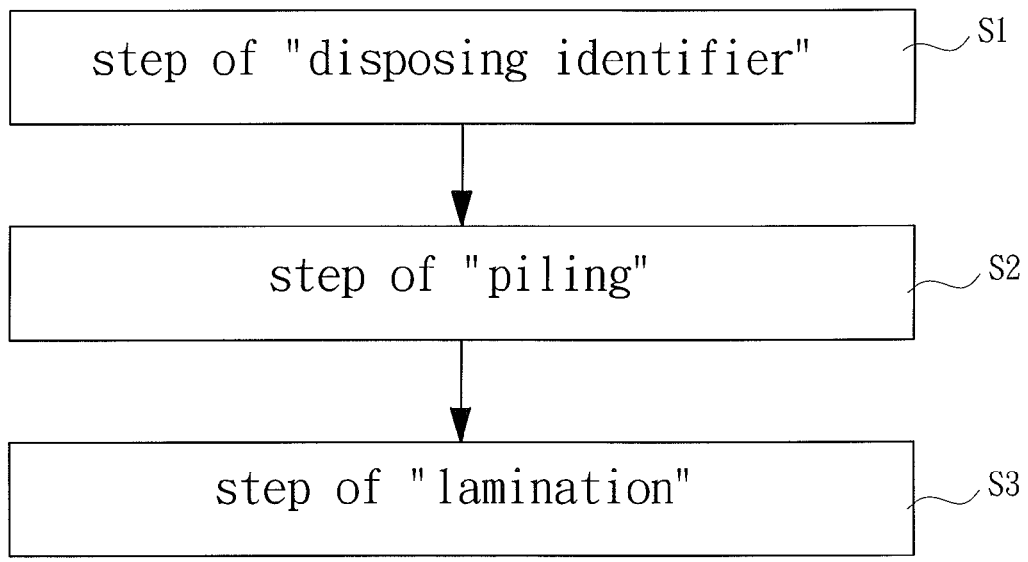
FIG. 4 is a flow chart illustrating a manufacturing method of an identifiable print circuit board of the present invention.

Referring to FIG. 4, a manufacturing method of an identifiable print circuit board comprises a step of "disposing an identifier S1", a step of "piling S2", and a step of "lamination S3".

Figure 5:
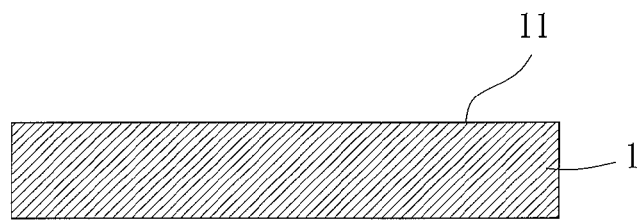
FIG. 5 shows a cross sectional view of a base plate of the present invention.
Figure 6:
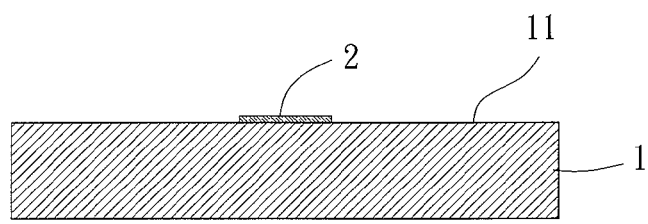
FIG. 6 is a diagram illustrating a step of disposing an identifier in the present invention.

With reference to FIGS. 5 and 6, in the step of "disposing an identifier S1" of a preferable embodiment of the present invention, a base plate 1 with a surface 11 defined as a manufacturing surface, and a primary identifier 2 are provided. The primary identifier 2 is disposed on the manufacturing surface of the base plate 1. More specifically, the base plate 1 of the present embodiment is made of copper clad laminate (CCL) but is not limited as it may be made of any material that is adapted for use. The primary identifier 2 can be made either by directly printing on the surface 11 of the base plate 1, or by manufacturing into the form of a tab and then sticking the tab on the base plate 1 for recognition. As an example, the primary identifier 2 is manufactured into a tab and stuck on the manufacturing surface of the base plate 1 in the present embodiment. The primary identifier 2 can be of any type including numbers, patterns or bar codes. Therefore, with the step of "disposing an identifier S1", it is sufficient to monitor each base plate 1 by recognizing the primary identifier 2 in the following manufacturing processes.

Figure 7:
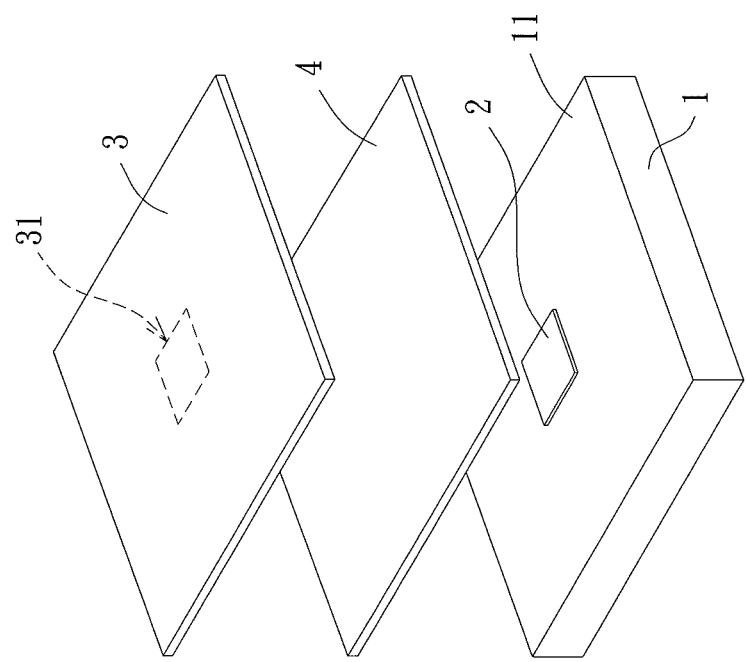
FIG. 7 is a diagram illustrating a step of piling in the present invention.
Figure 7:
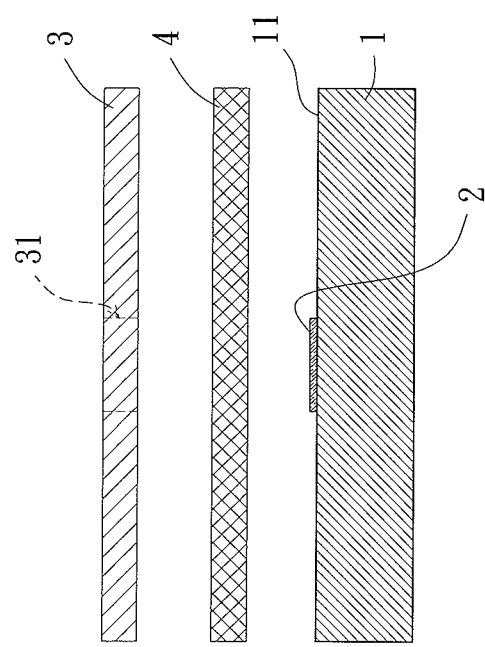

With reference to FIG. 7, in the step of "piling S2" of a preferable embodiment of the present invention, a circuit layer 3 with a penetrating area 31, and a light-emitting insulating layer 4 are further provided. The circuit layer 3 and the light-emitting insulating layer 4 are sequentially piled on the manufacturing surface of the base plate 1, with the penetrating area 31 in adjustment of the position of the primary identifier 2. Precisely, there is at least one etched metal circuit formed in the circuit layer 3, and the circuit of the present embodiment is etched copper circuit, with the etched copper circuit distributed over the circuit layer 3, except the penetrating area 31. The penetrating area 31 is transparent or translucent for light emitting, and has a similar size to the primary identifier 2. The light-emitting insulating layer 4 is transparent or translucent, being pervious of light. The light-emitting insulating layer 4 provides a conjunction to the base plate 1 and the circuit layer 3, and also to insulate the base plate 1 from the circuit layer 3 for preventing shunt. The light-emitting insulating layer 4 can be a colored or colorless light-emitting insulating layer, and preferably contains a fiberglass sheet for strengthening its structural strength. As an example, the light-emitting insulating layer 4 of the present invention is a colored thermosetting fiberglass film consisting of a fiberglass sheet coated with a colored thermosetting glue, such as polypropylene. In the embodiment, the light-emitting insulating layer 4 and the circuit layer 3 are sequentially piled on the surface 11 of the base plate 1, with the penetrating area 31 corresponding to the position of the primary identifier 2, to clearly recognize the primary identifier 2 rather than being sheltered from the etched copper circuit of the circuit layer 3.

Figure 8:
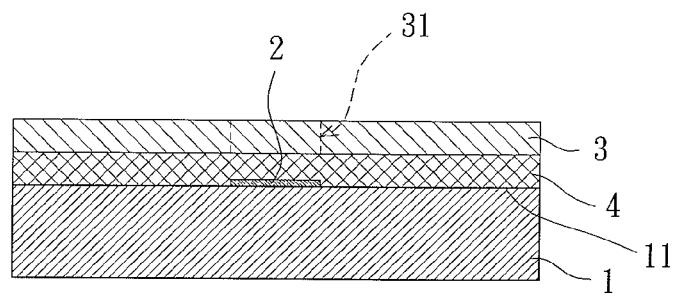
FIG. 8 is a diagram illustrating a step of lamination in the present invention.

Referring to FIG. 8, in the step of "lamination S3", the base plate 1, the light-emitting insulating layer 4 and the circuit plate 3 are laminated at a temperature not less than 150° C. and a pressure not less than 280 psi to obtain a print circuit board. More specifically, the previously piled base plate 1, the light-emitting insulating layer 4 and the circuit layer 3 are laminated at a temperature not less than 150° C. and a pressure not less than 280 psi, which makes the surfaces of the light-emitting insulating layer 4 fused and respectively mounted to the base plate 1 and the circuit layer 3 to obtain the print circuit board of the present invention. As an example, the lamination of the present embodiment is processed at 150° C. and 280 psi. In this situation, light can successfully pass through the transparent light-emitting insulating layer 4, as well as the penetrating area 31, so that the primary identifier 2 can be recognized by naked eyes or any identifying machine even if there are layers of the light-emitting insulating layer 4 and the circuit layer 3 piled on the primary identifier 2. Thus, the obtained print circuit board of the present invention can be easily traced and monitored in the following manufacturing processes. Otherwise, the manufacturing of the print circuit layer is not particularly limited to the surface 11 of the base plate 1, as two layers of the light-emitting insulating layer 4 and two layers of the circuit layer 3 can be respectively piled and laminated on both surfaces of the base plate 1 to obtain a print circuit board with bi-layered circuit layers.

On account of the step of "disposing an identifier S1" of the present invention by disposing the primary identifier 2 on the surface of the base plate 1, the obtained print circuit board can be effectively monitored during the manufacturing process by recognizing the primary identifier 2, to precisely control the quality of the print circuit board. Moreover, the light-emitting insulating layer 4 is transparent and pervious to light, and the circuit layer 3 has the penetrating area 31 in alignment with the position of the primary identifier 2. Therefore, the primary identifier 2 can be clearly recognized but cannot be blocked by the circuit layer 3 and the light-emitting insulating layer 4.

Figure 9:
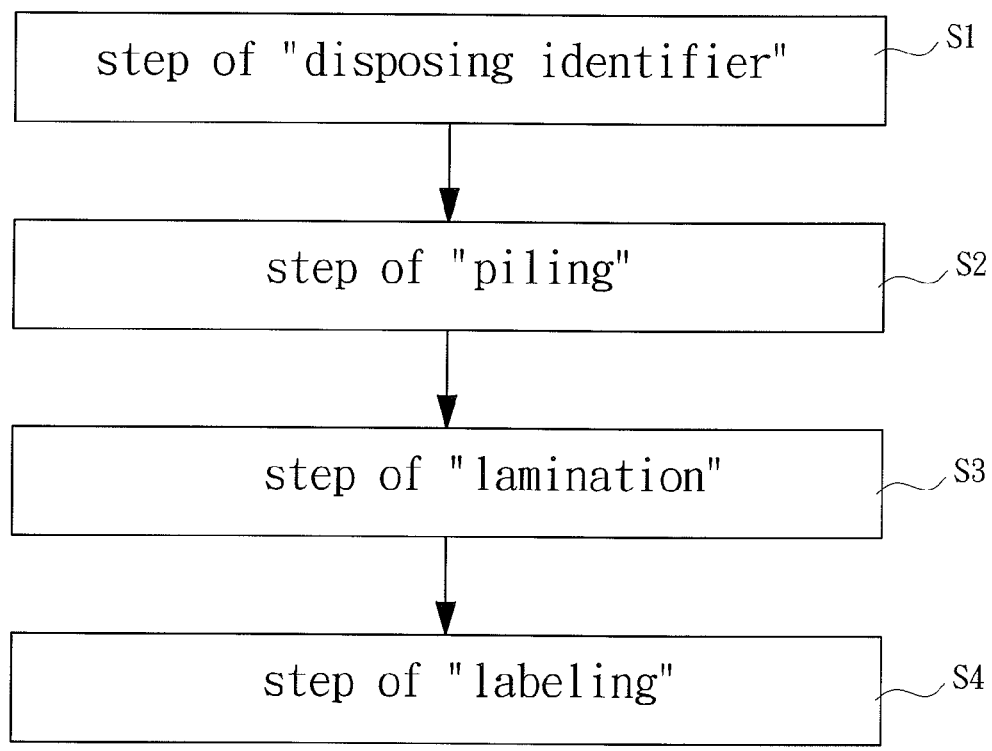
FIG. 9 is another flow chart illustrating a manufacturing method of an identifiable print circuit board of the present invention.
Figure 10:
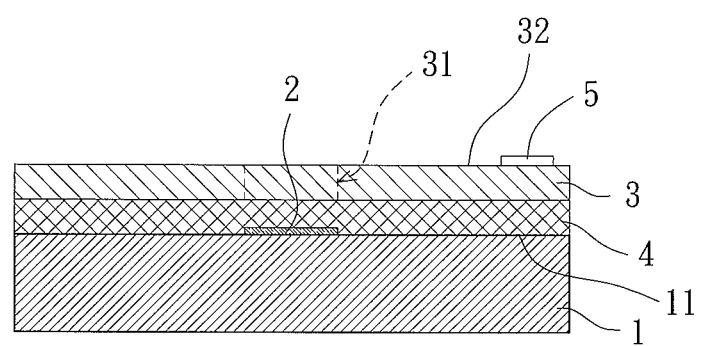
FIG. 10 is a diagram illustrating a step of labeling in the present invention.

Additionally, with reference to FIGS. 9 and 10, the manufacturing method of the identifiable print circuit board further comprises a step of "labeling S4", by recognizing the primary identifier 2, and further disposing a secondary identifier 5 on a surface 32 of the circuit layer 3. Precisely, after processing the steps of "piling S2" and "lamination S3", it is preferable to provide a new identifier to the obtained print circuit board according to the information of the primary identifier 2 on the surface 32 of the circuit layer 3. For example, if the primary identifier 2 is 999, another identifier 999-1 can be given as the secondary identifier 5 of the present invention and disposed on the surface 32 of the circuit layer 3 after the steps of "piling S2" and "lamination S3". Preferably, the secondary identifier 5 is given to the print circuit board after each section of the manufacturing processes for obtaining an accurate record of manufacturing history of each print circuit board. Accordingly, for example, the obtained print circuit board marked as 999 will have a secondary identity, 999-1, for recognizing the first section of the manufacturing process of the print circuit board 999, another secondary identity, 999-2, for recognizing the second section of the manufacturing process of the print circuit board 999, and so on, so that each section of the manufacturing process will have a corresponding number for convenient tracing.

Figure 11:
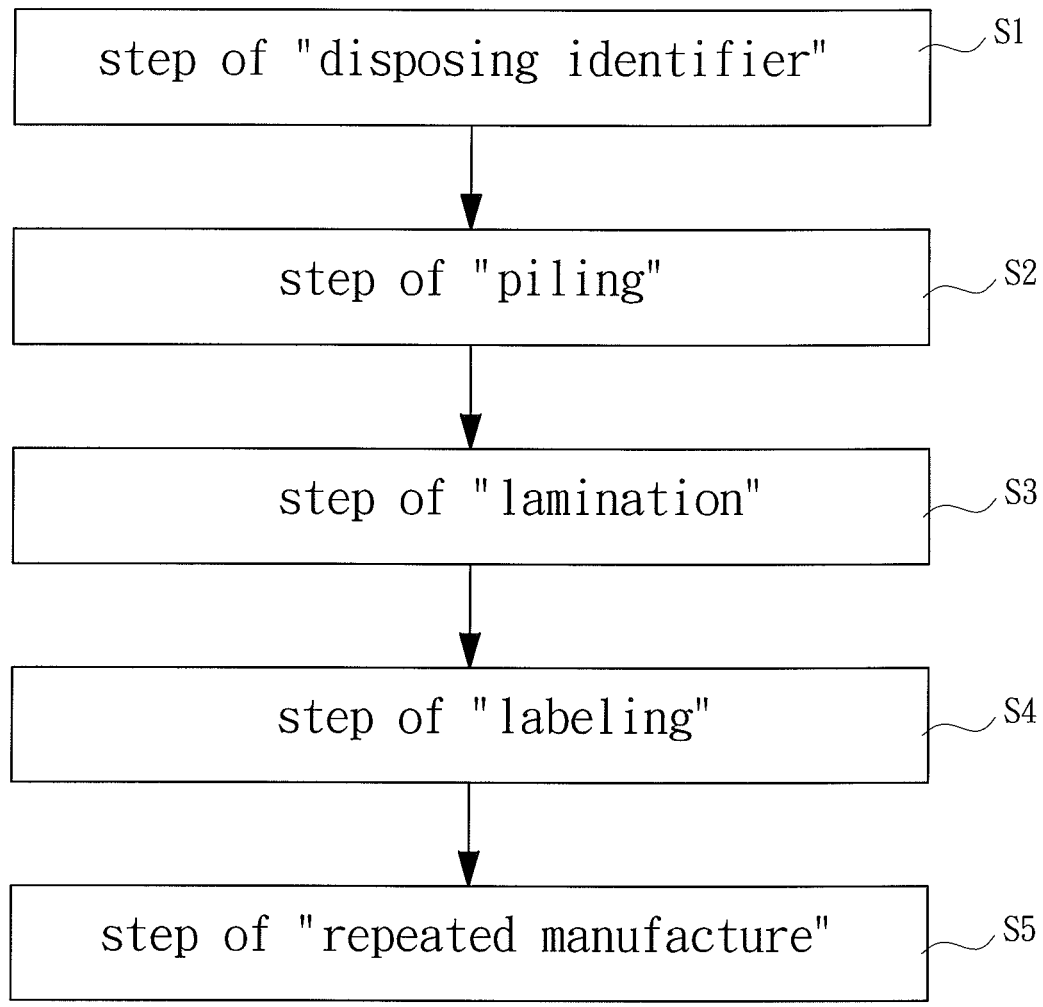
FIG. 11 is the other flow chart illustrating a manufacturing method of an identifiable print circuit board of the present invention.
Figure 12:
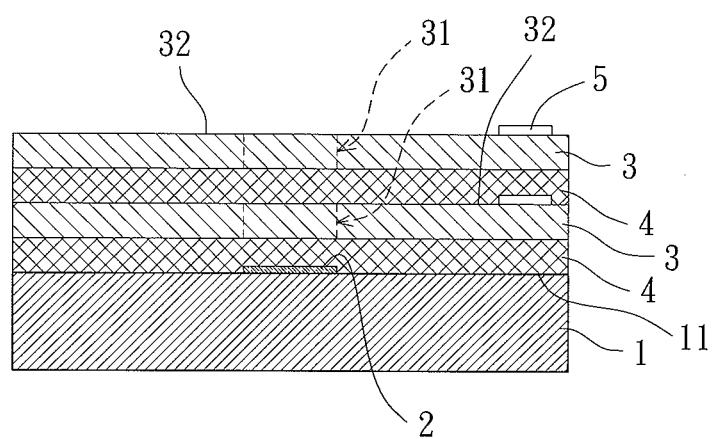
FIG. 12 is a diagram illustrating a step of repeated manufacture in the present invention.

Furthermore, with reference to FIGS. 11 and 12, the manufacturing method of the present invention further comprises a step of "repeated manufacture S5" after the step of "labeling S4", by defining the surface of the circuit layer 3 with the secondary identifier 5 as a new manufacturing surface, and repeatedly processing the steps of "piling S2", "lamination S3" and "labeling S4", in order to obtain a print circuit board with multilayered circuit layers. More specifically, multilayered circuit layers can be generated in the step of "repeated manufacture S5" by repeatedly piling and laminating additional light-emitting insulating layers and additional circuit layers on the surface 32 of the circuit layer 3, to obtain the print circuit board with multilayered circuit layers, followed by giving another identifier to the obtained print circuit board with multilayered circuit layers for recording and monitoring the manufacturing process. Thus, the dispositions of the primary identifier 2 and the secondary identifier 5 are sufficient to precisely monitor each print circuit board in each manufacturing process.

In summary, the manufacturing method of identifiable print circuit board of the present invention provides the primary identifier 2 to the base plate 1 at the first step for easy monitoring of the labeled base plate 1 during the manufacturing process, and the secondary identifier 5 to the obtained print circuit board in each manufacturing process for easy control of the quality of the print circuit board. As a result, according to the primary identifier 2 and the secondary identifier 5, the manufacturing history of each print circuit board can be precisely recorded, thereby allowing for timely trace backs to the trouble spot of the manufacturing process and adjustments according to the obtained print circuit board. In this way, both the quality and efficiency of the manufacturing process of the print circuit board can be specifically controlled.

Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A manufacturing method of an identifiable print circuit board comprising:
   providing a base plate defining a surface of the base plate as a manufacturing surface;
   disposing a primary identifier on the manufacturing surface, with the primary identifier being in a form of an identifiable number or a pattern for monitoring history, with an area of the primary identifier being smaller than an area of the manufacturing surface;
   sequentially piling an insulating layer and a circuit layer on the manufacturing surface and over the primary identifier, with the insulating layer being intermediate the manufacturing surface and the circuit layer, with the insulating layer being transparent and pervious to light, with the circuit layer including a penetrating area extending therethrough in alignment with the primary identifier, with the penetrating area being transparent or translucent for light emitting; and
   laminating the base plate, the insulating layer, and the circuit layer at a temperature not less than 150° C. and a pressure not less than 280 psi to obtain a print circuit board.

2. The manufacturing method of the identifiable print circuit board as defined in claim 1, wherein disposing the primary identifier comprises directly printing the primary identifier on the manufacturing surface of the base plate.

3. The manufacturing method of the identifiable print circuit board as defined in claim 1, with disposing the primary identifier comprises manufacturing a tab of the area smaller than the manufacturing surface, and sticking the tab on the manufacturing surface of the base plate.

4. The manufacturing method of the identifiable print circuit board as defined in claim 1, further comprising after laminating the base plate, generating a secondary identifier on a surface of the circuit layer opposite to the insulating layer according to the primary identifier.

5. The manufacturing method of the identifiable print circuit board as defined in claim 4, further comprising by providing the surface of the circuit layer with the secondary identifier as another manufacturing surface, and sequentially piling a further insulating layer and a further circuit board on the other manufacturing surface to obtain the print circuit board with multilayered circuit layers.

* * * * *